(12) United States Patent
Yeh

(10) Patent No.: US 6,992,535 B2
(45) Date of Patent: Jan. 31, 2006

(54) VOLTAGE-CONTROLLED OSCILLATOR HAVING A BANDPASS FILTER

(75) Inventor: Ming-Shiumn Yeh, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 204 days.

(21) Appl. No.: 10/377,708

(22) Filed: Mar. 4, 2003

(65) Prior Publication Data

US 2004/0095198 A1 May 20, 2004

(30) Foreign Application Priority Data

Nov. 19, 2002 (TW) ........................ 91218577 U

(51) Int. Cl.
*H03B 1/00* (2006.01)

(52) U.S. Cl. ................. 331/177 V; 331/74; 331/117 R; 331/117 FE; 331/116 R; 331/116 FE; 331/167; 331/36 C

(58) Field of Classification Search .............. 331/74, 331/177 V, 117 R, 117 FE, 116 R, 116 FE, 331/167, 36 C, 76, 17
See application file for complete search history.

(56) References Cited

U.S. PATENT DOCUMENTS

| | | | | |
|---|---|---|---|---|
| 4,023,108 A | * | 5/1977 | Torii | ........................ 455/183.1 |
| 6,549,083 B2 | * | 4/2003 | Kanazawa et al. | ............ 331/76 |

* cited by examiner

*Primary Examiner*—Arnold Kinkead
(74) *Attorney, Agent, or Firm*—Birch Stewart Kolasch & Birch, LLP

(57) ABSTRACT

A voltage-controlled oscillator (VCO) having a bandpass filter includes an oscillation circuit and a bandpass filter. The oscillation circuit outputs a first oscillation frequency with a harmonic distortion according to a tuning voltage. The first oscillation frequency is then input to the bandpass filter and the harmonic distortion of the first oscillation frequency is filtered. Therefore, a second oscillation frequency without the harmonic distortion is output from the bandpass filter. The invention is characterized by that the bandpass filter that removes the harmonic distortion from the VCO.

13 Claims, 3 Drawing Sheets

US 6,992,535 B2

VOLTAGE-CONTROLLED OSCILLATOR HAVING A BANDPASS FILTER

BACKGROUND OF THE INVENTION

1. Field of Invention

The invention relates to a voltage-controlled oscillator and, in particular, to a voltage-controlled oscillator having a bandpass filter.

2. Related Art

The voltage-controlled oscillator (VCO) is a frequency-varying oscillation circuit that changes its output frequency according to an external voltage. The varying range of the frequency is determined according to its purposes. It is a common element in high-frequency circuits or communication systems.

A conventional VCO shown in FIG. 1 includes a resonance circuit 100, an oscillation circuit 200, and a buffer amplifying circuit 300. The resonance circuit 100 is used to output a harmonic frequency signal which functions as the oscillation frequency of the oscillation circuit. The resonance circuit 100 includes capacitors C1, C2, C3 and C4, inductors L1 and L2, and a diode D1. When a tunable voltage Vt is imposed on the input terminal of the resonance circuit 100, it outputs a harmonic frequency signal accordingly. The oscillation circuit 200 outputs a first oscillation signal according to the harmonic frequency signal output from the resonance circuit 100. The oscillation circuit 200 is composed of a first transistor TR1 and a capacitor C7. The harmonic frequency signal is inputted into the base of the first transistor TR1, and the first oscillation signal is outputted from its emitter. The emitter of the first transistor TR1 is further connected in series with a resistor R4 and an inductor L3 functioning as the radio frequency choke. The buffer amplifying circuit 300 includes a second transistor TR2, a microstrip SLIN1 and a capacitor C8. The first oscillator signal is amplified into a first oscillation frequency through the buffer amplifying circuit 300. The first oscillation frequency is then outputted through the collector of the buffer amplifying circuit 300 and the capacitor C9. Furthermore, a capacitor C10 is coupled between the ground and the capacitor C9.

The resistors R1, R2, and R3 are used to determine the base bias voltages of the first transistor TR1 and the second transistor TR2. One end of the resistor R1 is coupled to a power supply Vcc, while the other coupled to the resistor R2. One end of the resistor R3 is coupled to the resistor R2, while the other to the ground.

Affected by the circuit elements and/or circuit board, the first oscillation frequency outputted from the VCO disclosed in FIG. 1 usually has some distortion. Such harmonic distortions (including second-order or higher harmonic distortions) render the circuit unable to achieve desired effects. The frequency of these harmonic distortions may even interfere other frequency ranges or even the same one. Therefore, how to reduce the harmonic distortion is an important concern in circuit designs.

SUMMARY OF THE INVENTION

A primary objective of the invention is to provide a voltage-controlled oscillator (VCO) having a bandpass filter. Using the band-passing character of the bandpass filter, the harmonic distortion at the output terminal of the VCO is removed.

To achieve the above objective, the disclosed VCO includes an oscillation circuit and a bandpass filter. The oscillation circuit outputs a first oscillation frequency according to a tuning voltage. The first oscillation frequency contains a harmonic distortion. The bandpass filter receives the first oscillation frequency, removes the harmonic distortion contained therein, and then outputs a second oscillation frequency.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 2:
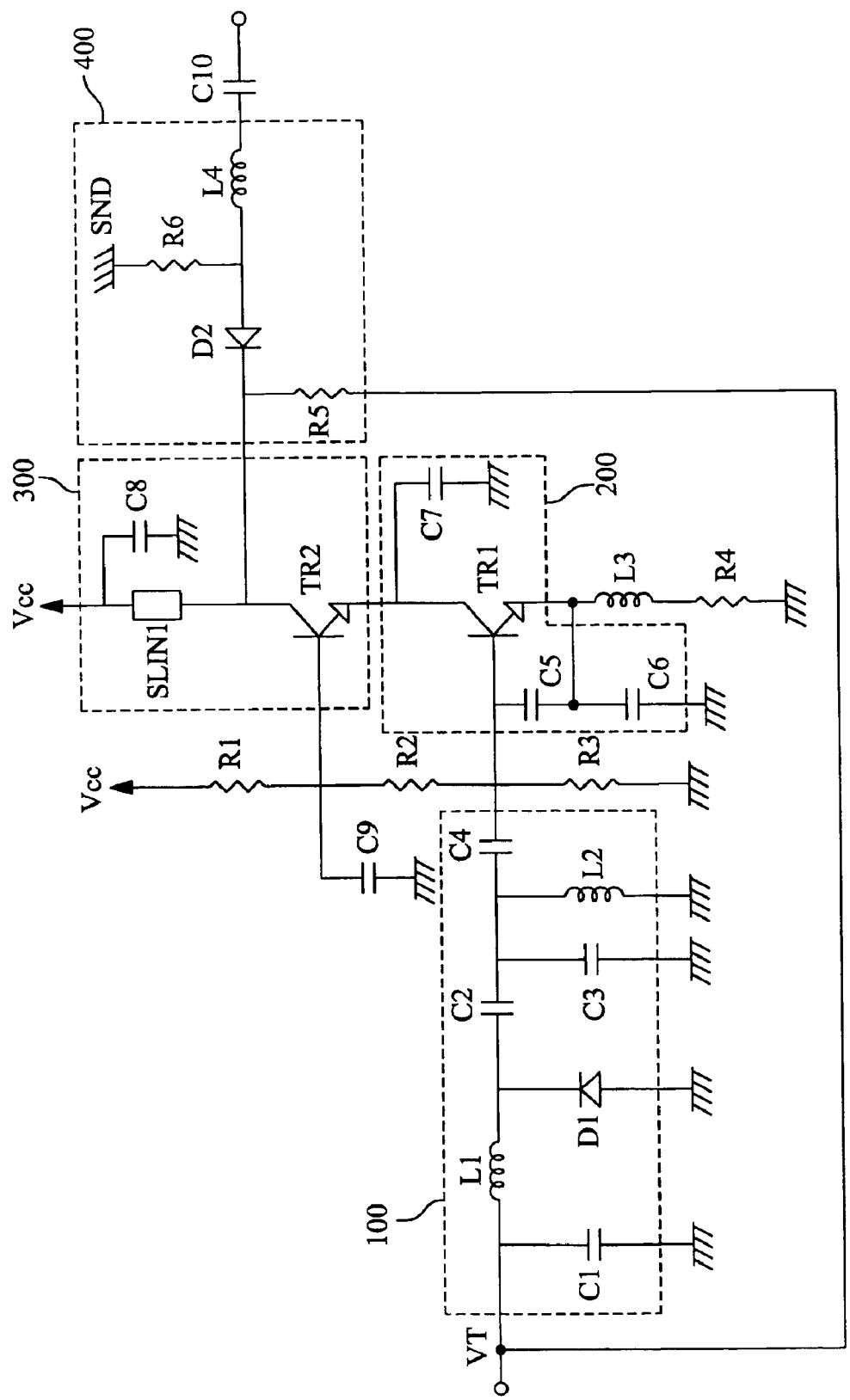
FIG. 2 is a circuit diagram of a VCO having a bandpass filter according to the present invention.

As shown in FIG. 2, the voltage-controlled oscillator (VCO) includes a resonance circuit 100, an oscillation circuit 200, a buffer amplifying circuit 300, and a bandpass filter 400.

The resonance circuit 100, which outputs a harmonic signal functioning as the oscillation frequency of the oscillation circuit, includes capacitors C1, C2, C3, C4, inductors L1, L2, and a diode D1. When a tuning voltage Vt is imposed on the resonance circuit 100, the resonance circuit 100 outputs a harmonic frequency signal accordingly.

The oscillation circuit 200 outputs a first frequency signal according to the harmonic frequency signal outputted from the resonance circuit 100. The oscillation circuit 200, which is a Colpitts-type oscillator, includes a first transistor TR1 and capacitors C5, C6, C7. The harmonic frequency signal is inputted into the base of the first transistor TR1, and the first frequency signal is outputted via the emitter of the first transistor TR1. The emitter of the first transistor TR1 is further connected in series with a resistor R4 and an inductor L3 functioning as the radio frequency choke.

The buffer amplifying circuit 300 includes a second transistor TR2, a microstrip SLIN1 and a capacitor C8. Through the buffer amplifying circuit 300, the first frequency signal is amplified into the first oscillation frequency to be outputted via the collector of the buffer amplifying circuit 300. Furthermore, a capacitor C9 is coupled between the base and ground of the second transistor TR2.

The resistors R1, R2, R3 are used to determine the base bias voltage of the first transistor TR1 and the second transistor TR2. One end of the resistor R1 is coupled to the power supply Vcc, and the other coupled to the resistor R2. One end of the resistor R3 is coupled to the resistor R2, and the other coupled to the ground.

The bandpass filter 400 includes resistors R5, R6, capacitance-varying diode D2, and an inductor L4 for outputting a second oscillation frequency according to the first oscillation frequency. The first oscillation frequency contains a harmonic distortion. After passing through the bandpass filter 400, the harmonic distortion is filtered and removed.

The anode of capacitance-varying diode D2 is coupled to the collector of the second transistor TR2. The cathode is coupled to the inductor L4. The other end of the inductor L4 is coupled to a capacitor C10 for outputting the second oscillation frequency. Moreover, the resistor R6 is coupled between the cathode and the ground of the capacitance-varying diode D2. The resistor R5 is coupled between the anode of the capacitance-varying diode D2 and the input terminal of the resonance circuit 100. When the tuning voltage Vt enters the bandpass filter 400 via the resistor R5, the capacitance of the capacitance-varying diode D2 changes accordingly. The passing band of the bandpass filter 400 then changes according to the capacitance of the capacitance-varying diode D2.

Figure 3A:
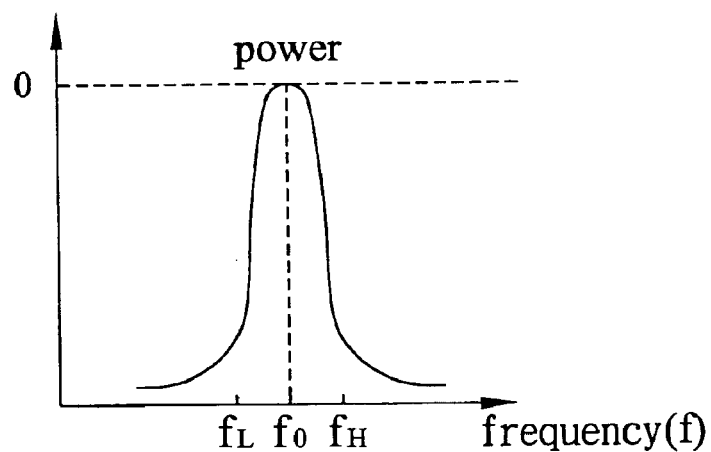
FIG. 3A is a frequency response diagram of an ideal bandpass filter.

The bandpass filter only allows signals with certain frequencies to pass through. Signals outside the frequency region are blocked. The frequency band that can go through is called the passing band. Such signals do not seriously attenuate as they pass through. The passing band has an upper threshold frequency and a lower threshold frequency. The frequency response diagram of a bandpass filter is shown in FIG. 3A. The horizontal axis is the frequency, and the vertical axis is the power in units of decibel (dB). The central frequency is $$f_0 = \frac{1}{2\pi\sqrt{LC}},$$

where L is the inductance and C is the capacitance. The frequency band for signals to go through is $f_L \leq f \leq f_H$. The frequencies beyond $f_L$ and $f_H$ are called the stop band. Here $f_H$ is the upper threshold frequency, and $f_L$ is the lower threshold frequency. Normally, they are defined using 3 dB threshold frequencies.

From the central frequency $$f_0 = \frac{1}{2\pi\sqrt{LC}}$$

of the bandpass filter, it is easy to see that one can modify it by changing the capacitance for a fixed inductance. The voltage can be controlled to change the capacitance of the capacitor. The harmonic frequency of the resonance circuit is thereby changed to modify the passing band. The invention utilizes this property to remove the harmonic distortion in the VCO.

For example, when the voltage is $V_0$, the frequency response of the bandpass filter is as shown in FIG. 3A. The central frequency is $$f_0 = \frac{1}{2\pi\sqrt{LC_0}},$$

the upper threshold frequency is $f_H$, and the lower threshold frequency is $f_L$. If one wants to change the passing band so that signals of different frequencies can pass through (e.g. shifting the central frequency to the lower threshold frequency $f_L$), then a tuning voltage $V_1$ is imposed on the voltage-controlled capacitor 110 whose capacitance is $C_1$. At this moment, the central frequency becomes $$f_L = \frac{1}{2\pi\sqrt{LC_1}}.$$

Figure 3B:
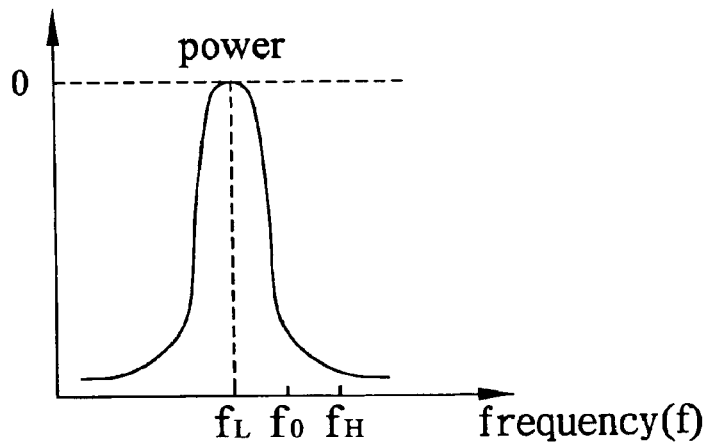
FIG. 3B is another frequency response diagram of the bandpass filter.

As shown in FIG. 3B, the frequency-responding wave shifts to the left, so that the passing band shifts to the left too.

If one wants to change the central frequency to the lower threshold frequency $f_H$, then another tuning voltage $V_2$ can be imposed on the voltage-controlled capacitor whose capacitance is now $C_2$. The central frequency becomes $$f_H = \frac{1}{2\pi\sqrt{LC_2}}.$$

Figure 1:
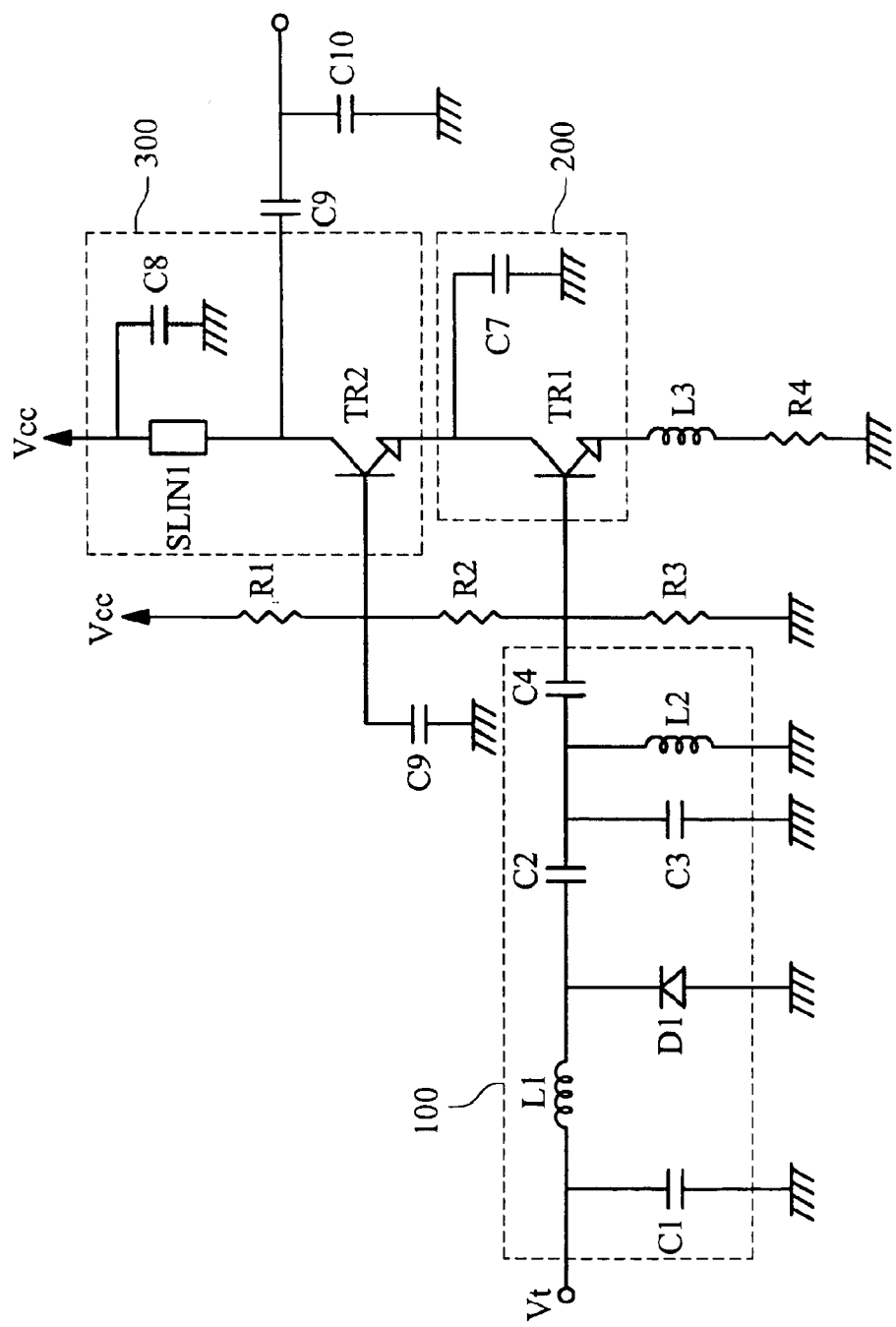
FIG. 1 is a circuit diagram of a conventional VCO according to the prior art.
Figure 3C:
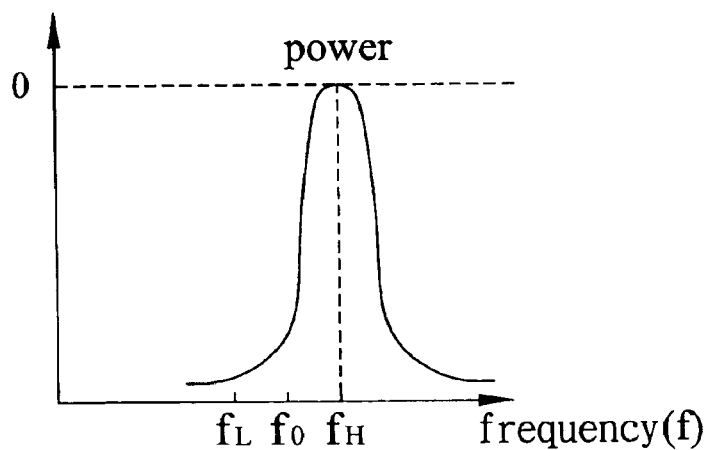
FIG. 3C is yet another frequency response diagram of the bandpass filter.

As shown in FIG. 3C, the frequency-responding wave shifts to the right and the passing band shifts to the right too. In summary, a tuning voltage is utilized to control the capacitance of a voltage-controlled capacitor 110. The upper and the lower threshold frequencies change accordingly so as to vary the passing band Take FIG. 1 as an example. When the tuning voltage Vt=0.5V, the power is −20 dBm when $f_0$=460 MHz and the power is −30 dBm $f_1$=2$f_0$=920 MHz. Therefore, the harmonic distortion is −30−(−20)=−10 dBm. When the tuning voltage Vt=2.2V, the power is −23 dBm when $f_0$=520 MHz and the power is −33 dBm when $f_1$=2$f_0$=1040 MHz. Therefore, the harmonic distortion is −33−(−23)=−10 dBm. Thus, the second harmonic distortion is −30−(−20)=−10 dBm.

According to the disclosed VCO having a bandpass filter, the harmonic distortion can be effectively removed. When the tuning voltage Vt=0.5V, the power is −20 dBm when $f_0$=460 MHz and the power is −37 dBm when $f_1$=2$f_0$=920 MHz. Therefore, the harmonic distortion is −37−(−20)=−17 dBm. When the tuning voltage Vt=2.2V, the power is −23 dBm when $f_0$=520 MHz and the power is −39 dBm when $f_1$=2$f_0$=1040 MHz. Therefore, the harmonic distortion is −39−(−23)=−16 dBm. Thus, the second harmonic distortion is −37−(−20)=−17 dBm.

Consequently, using the band-passing character of the bandpass filter, the capacitance can be varied to change the passing band. Unnecessary distortion signals can thus be removed.

The invention combines a voltage-controlled capacitor, a resistor, and an inductor into a high-frequency bandpass filter. A tuning voltage is used to change the capacitance of the voltage-controlled capacitor so that the passing band of the bandpass filter can be varied. Therefore, signals of different frequencies can be controlled to pass through. Moreover, the harmonic distortion in the voltage-controlled oscillator can be removed by changing the passing band.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A voltage-controlled oscillator (VCO), comprising:
    an oscillation element, which comprises:
        a resonance circuit, which outputs a harmonic frequency signal according to a tuning voltage;
        an oscillation circuit, which outputs a first frequency signal according to the harmonic frequency signal; and
        a buffer amplifying circuit, which outputs a first oscillation frequency signal according to the first frequency signal, the first oscillation frequency having a harmonic distortion; and
    a bandpass filter, the central frequency of the bandpass filter being modified according to said tuning voltage which receives the first oscillation frequency, filters the harmonic distortion contained therein, and outputs a second oscillation frequency, according to said tuning voltage.

2. The VCO of claim 1, wherein the bandpass filter comprises a plurality of resistors, an inductor, and a capacitance-varying diode.

3. The VCO of claim 2, wherein the inductance of the inductor is fixed.

4. The VCO of claim 2, wherein the capacitance of the capacitance-varying diode is modified according to the tuning voltage.

5. The VCO of claim 1, wherein the resonance circuit further comprises a plurality of capacitors, a plurality of inductors, and a diode.

6. The VCO of claim 1, wherein the first frequency signal oscillates at the harmonic frequency.

7. The VCO of claim 1, wherein the oscillation circuit comprises a plurality of capacitors and a first transistor.

8. The VCO of claim 7, wherein the first transistor is a bipolar junction transistor.

9. The VCO of claim 1, wherein the buffer amplifying circuit comprises a second transistor, a microstrip, and a capacitor.

10. The VCO of claim 9, wherein the second transistor is a bipolar junction transistor.

11. A voltage-controlled oscillator (VCO), comprising:

an oscillation element, which outputs a first oscillation frequency according to a tuning voltage, the first oscillation frequency having a harmonic distortion; and a bandpass filter, which receives the first oscillation frequency, filters the harmonic distortion contained therein, and outputs a second oscillation frequency;

said oscillation element comprising:

a resonance circuit, which outputs a harmonic frequency signal;

an oscillation circuit, which outputs a first frequency signal according to the harmonic frequency signal; and a buffer amplifying circuit, which outputs the first oscillation frequency according to the first frequency signal;

wherein the buffer amplifying circuit comprises a second transistor, a microstrip, and a capacitor.

12. The VCO of claim 11, wherein the second transistor is a bipolar junction transistor.

13. A voltage-controlled oscillator (VCO), comprising:

an oscillation element including a buffer amplifying circuit, which outputs a first oscillation frequency according to a tuning voltage, the first oscillation frequency having a harmonic distortion; and a bandpass filter, the central frequency of the bandpass filter being modified according to said tuning voltage, which receives the first oscillation frequency, filters the harmonic distortion contained therein, and outputs a second oscillation frequency, according to said tuning voltage.

* * * * *